(12) United States Patent
Watanabe et al.

(10) Patent No.: US 6,897,502 B2
(45) Date of Patent: May 24, 2005

(54) SEMICONDUCTOR MEMORY DEVICE AND ITS MANUFACTURING METHOD

(75) Inventors: Shinichi Watanabe, Yokohama (JP); Toyota Morimoto, Sagamihara (JP); Tohru Ozaki, Tokyo (JP); Haruhiko Koyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 5 days.

(21) Appl. No.: 10/620,698

(22) Filed: Jul. 17, 2003

(65) Prior Publication Data

US 2004/0227171 A1 Nov. 18, 2004

(30) Foreign Application Priority Data

May 12, 2003 (JP) ........................................ 2003-132703

(51) Int. Cl.[7] .............................................. H01L 29/76
(52) U.S. Cl. ................... 257/295; 257/298; 257/303; 257/306; 257/324; 438/3; 438/240
(58) Field of Search .................. 257/68, 71, 295–314, 257/324–326, 330–334; 438/3, 240, 259, 270, 271, 589

(56) References Cited

U.S. PATENT DOCUMENTS 5,300,804 A * 4/1994 Arai ............................ 365/104
6,593,613 B1 * 7/2003 Alsmeier et al. ............ 257/306
6,717,200 B1 * 4/2004 Schamberger et al. ...... 257/302

FOREIGN PATENT DOCUMENTS

| JP | 10-255483 | 9/1998 |
|---|---|---|
| JP | 2002-329795 | 11/2002 |

* cited by examiner

*Primary Examiner*—Andy Huynh
(74) *Attorney, Agent, or Firm*—Oblon, Spivak, McClelland, Maier & Neustadt, P.C.

(57) ABSTRACT

A first impurity diffusion area is formed in the semiconductor substrate at a bottom of the first trench formed in a surface of the semiconductor substrate. A second impurity diffusion area is formed in the surface of the semiconductor substrate, each have one end contacting a first side wall of the first trench, and each have the same conductive type as the first impurity diffusion area. A first gate electrode is provided on the first side wall between the first and second impurity diffusion areas with a gate insulating film interposed therebetween. A first ferroelectric film is provided on a first lower electrode, which is provided on the second impurity area. A first upper electrode is provided on the first ferroelectric film. A first interconnection layer is provided above the first upper electrode. A first contact plug electrically connects the first interconnection layer and first impurity diffusion area.

28 Claims, 8 Drawing Sheets

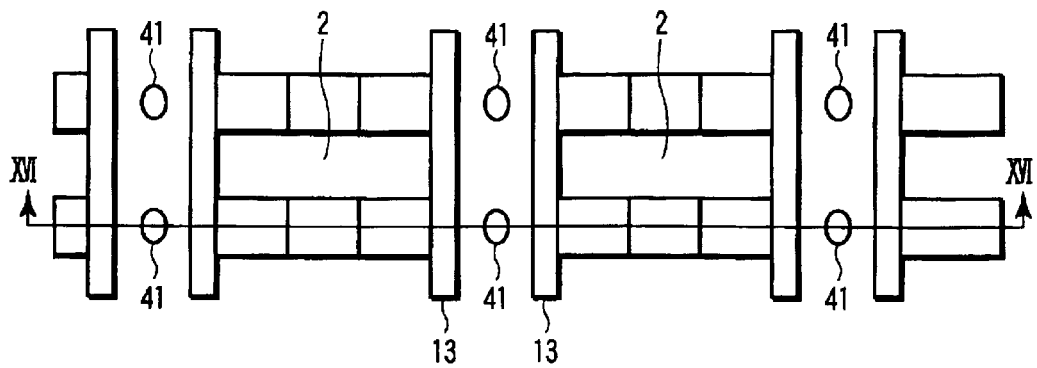
F I G. 15
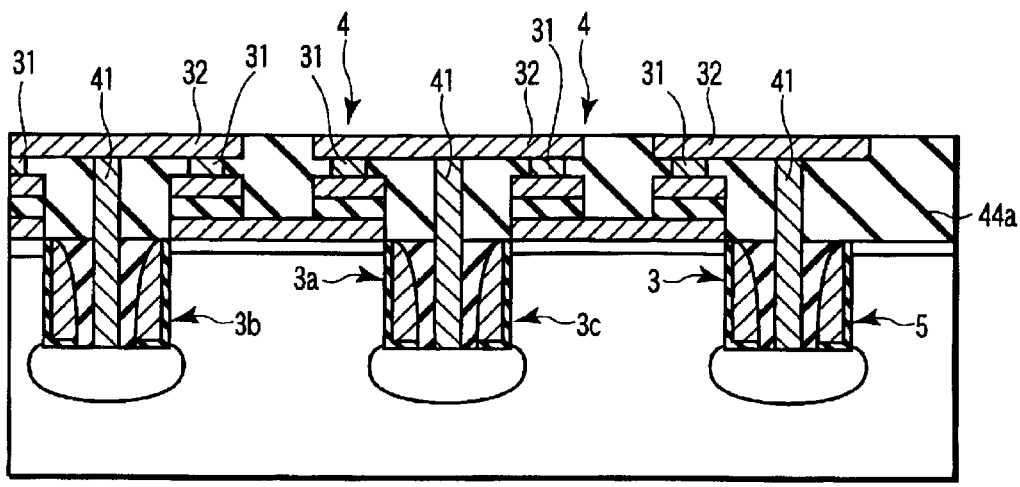
F I G. 16
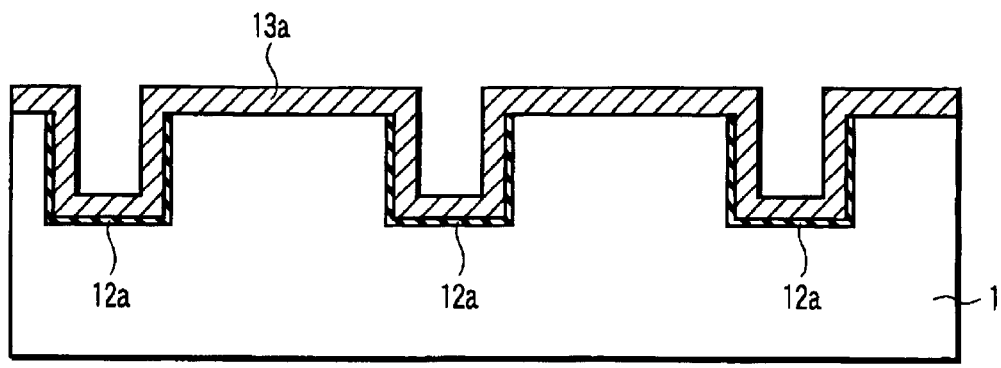
F I G. 17

SEMICONDUCTOR MEMORY DEVICE AND ITS MANUFACTURING METHOD

CROSS-REFERENCE TO RELATED APPLICATIONS

This application is based upon and claims the benefit of priority from the prior Japanese Patent Application No. 2003-132703 filed May 12, 2003, the entire contents of which are incorporated herein by reference.

BACKGROUND OF THE INVENTION

1. Field of the Invention

The present invention relates to a semiconductor memory device, e.g. a semiconductor memory device in which a memory cell includes a ferroelectric material.

2. Description of the Related Art

Ferroelectric memories are known in which a memory capacitor includes a ferroelectric material. Some of them are TC-parallel-unit series connection type ferroelectric memories. These memories have a structure in which a plurality of unit cells are electrically connected in series, the unit cell comprising a cell transistor (T) in which opposite ends of a capacitor (C) are connected between the source and drain of the transistor.

FIG. 21 is a sectional view schematically showing a TC-parallel-unit series connection type ferroelectric memory (hereinafter simply referred to as a "semiconductor memory device" unless otherwise specified). As shown in FIG. 21, memory cell transistors 104 each composed of a gate electrode 102 and source/drain diffusion areas 103a, 103b are formed on a surface of a semiconductor substrate 101. A memory cell capacitor 114 composed of a lower electrode 111, a ferroelectric film 112, and an upper electrode 113 is formed above the transistor 104.

The lower electrode 111 is connected to the source/drain diffusion area 103a by a contact 121. The upper electrode 113 is connected to the source/drain diffusion area 103b via a connection layer 122, a plate electrode 123, and a contact 124. One of the memory cell transistors 104 is connected to a select transistor 131. A source/drain diffusion area 103a of the select transistor 131 is connected to a bit line 133 via a contact 132.

Further, the structure shown in FIG. 22 is known as a ferroelectric memory having a structure different from the TC-parallel-unit series connection type. In the ferroelectric memory of this structure, the source/drain diffusion area 103b shared by the two transistors 104 is connected to a bit line 133 via the contact 132. The upper electrode 113 and the plate electrode 123 constitute a single electrode extending in a direction perpendicular to the sheet of the drawing.

To reduce the size of a semiconductor memory device while increasing its density, it is desirable to reduce an area per unit cell. For the semiconductor memory devices shown in FIGS. 21 and 22, the area per unit cell has been reduced by scaling down a design rule.

Thus, the more the area per unit cell shrinks, the more the gate length of a transistor decreases. However, too small a gate length may result in a short channel effect. The short channel effect may cause the memory cell transistor to malfunction. Thus, with the structures shown in FIGS. 21 and 22, the reduction in the area per unit cell is limited.

Further, the more the area per unit cell shrinks, the higher the aspect ratios of the contacts 121, 124, and 132 become. With high aspect ratios, when the contact 121, 124, and 132 are formed, the corresponding contact holes may not be sufficiently filled with a conductive material. As a result, inappropriate contacts may occur. Further, it is difficult to form the contact holes themselves.

BRIEF SUMMARY OF THE INVENTION

According to a first aspect of the present invention, there is provided a semiconductor device comprising: a semiconductor substrate; a first trench formed in a surface of the semiconductor substrate and having a first side wall; a first impurity diffusion area formed in the semiconductor substrate at a bottom of the first trench; a second impurity diffusion area formed in the surface of the semiconductor substrate, having one end in contact with the first side wall, and having the same conductive type as that of the first impurity diffusion area; a first gate electrode provided on the first side wall between the first impurity diffusion area and second impurity diffusion area with a gate insulating film interposed therebetween; a first lower electrode provided on the second impurity diffusion area; a first ferroelectric film provided on the first lower electrode; a first upper electrode provided on the first ferroelectric film; a first interconnection layer provided above the first upper electrode; and a first contact plug electrically connecting the first interconnection layer and first impurity diffusion area together.

According to a second aspect of the present invention, there is provided a semiconductor memory device having a plurality of memory cells connected in series, the memory cells each including a transistor and a capacitor having opposite ends connected to respective ends of the transistor, wherein each transistor comprises: a first impurity diffusion area formed in a semiconductor substrate at a bottom of one of a plurality of trenches formed in a surface of the semiconductor substrate; a second impurity diffusion area formed in the surface of the semiconductor substrate between the trenches, having opposite ends contacting side walls of the trenches, and having the same conductive type as that of the first impurity diffusion area; and a gate electrode provided on the side wall of the trench between the first impurity diffusion area and the second impurity diffusion area with a gate insulating film interposed therebetween, and each capacitor comprises: a lower electrode provided on the second impurity diffusion area; a ferroelectric film provided on the lower electrode; and an upper electrode provided on the ferroelectric film.

According to a third aspect of the present invention, there is provided a method of manufacturing a semiconductor memory device comprising: forming a trench in a surface a semiconductor substrate; forming a first impurity diffusion area in the semiconductor substrate at a bottom of the trench; forming a gate insulating film on a side wall and the bottom of the trench; forming a gate electrode on the gate insulating film; forming a second impurity diffusion area in the surface of the semiconductor substrate, the second impurity diffusion area having one end contacting the side wall of the trench, the second impurity diffusion area having the same conductive type as that of the first impurity diffusion area; forming a lower electrode on the second impurity diffusion area; forming a ferroelectric film on the lower electrode; forming an upper electrode on the ferroelectric film; forming a contact plug electrically connected to the first impurity diffusion area; and forming an interconnection layer above the upper electrode, the interconnection layer being electrically connected to the contact plug.

According to a fourth aspect of the present invention, there is provided a method of manufacturing a semiconductor memory device having a plurality of memory cells connected in series, the memory cells each including a transistor and a capacitor having opposite ends connected to respective ends of the transistor, the method comprising: forming a plurality of trenches in a surface of a semiconductor substrate, the trenches being apart from one another; forming first impurity diffusion areas in the semiconductor substrate at a bottom of each of the trenches; forming gate insulating films on side walls and a bottom of each of the trenches; forming gate electrodes on each of the gate insulating films; forming second impurity diffusion areas in the surface of the semiconductor substrate between the adjacent trenches, the second impurity diffusion areas each having opposite ends contacting the side walls of the trenches and having the same conductive type as that of the first impurity diffusion area; forming lower electrodes on each of the second impurity diffusion areas; forming ferroelectric films on each of the respective lower electrodes, the ferroelectric films being apart from one another; forming upper electrodes on each of the respective ferroelectric films; forming contact plugs electrically connected to each of the first impurity diffusion areas; and forming interconnection layers above the respective upper electrodes, the interconnection layers each being electrically connected to each of the contact plugs.

BRIEF DESCRIPTION OF THE SEVERAL VIEWS OF THE DRAWING

FIG. 15 is a sectional view schematically showing a step succeeding FIG. 13;

FIG. 16 is a sectional view of FIG. 15;

FIG. 17 is a sectional view schematically showing a variation of a first embodiment;

DETAILED DESCRIPTION OF THE INVENTION

Figure 1:
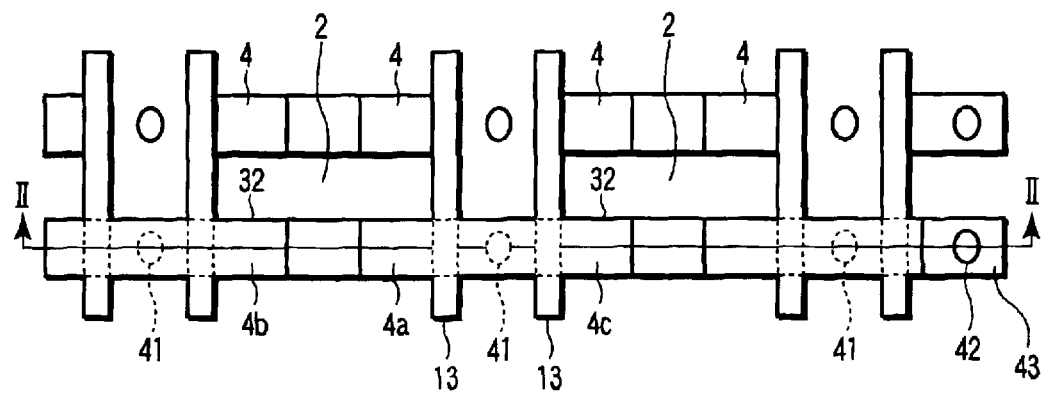
FIG. 1 is a plan view schematically showing a part of a semiconductor memory device according to a first embodiment of the present invention.

Embodiments of the present invention will be described below in detail with reference to the drawings. In the description below, components having substantially the same functions and arrangements are denoted by the same reference numerals. Duplicate description will be given only when required.

(First Embodiment)

Figure 2:
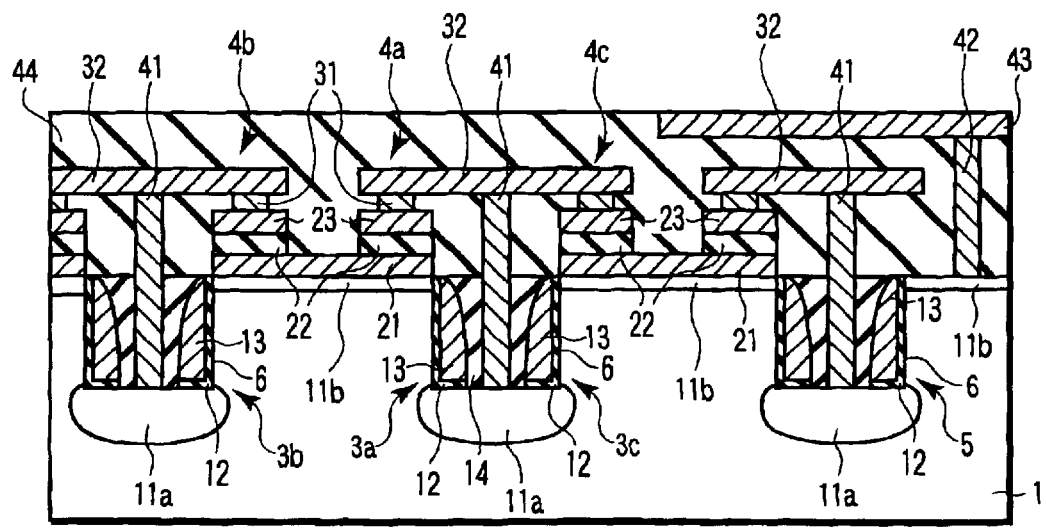
FIG. 2 is a sectional view of FIG. 1.

A first embodiment relates to a ferroelectric memory having parallel-unit series connection type structure including cell transistors (T) and capacitors (C). FIG. 1 is a plan view schematically showing a part of a semiconductor memory device according to a first embodiment of the present invention. FIG. 2 is a sectional view taken along line II—II in FIG. 1.

As shown in FIGS. 1 and 2, an element separation insulating film 2 is formed on a surface of a semiconductor substrate composed of, for example, monocrystal silicon. The element separation insulating film 2 separates element areas from one another. The semiconductor memory device has a memory cell transistor (hereinafter simply referred to as a "transistor" unless otherwise specified) 3 (3a, 3b, and 3c), a memory cell capacitor (hereinafter simply referred to as a "capacitor") 4 (4a, 4b, and 4c), and a selection transistor 5. The transistor 3 and the capacitor 4 constitute a memory cell.

A plurality of trenches 6 is formed in a surface of the semiconductor substrate 1 in the respective element areas. The transistor 3 is formed utilizing the semiconductor substrate 1 and the trenches 6. The transistor 3 (3a, 3b, and 3c) is composed of source/drain diffusion areas 11a and 11b and a gate insulating film 12, and a gate electrode 13.

The source/drain diffusion area 11a (impurity diffusion area) is formed in the semiconductor substrate 1 at the bottom of the trench 6. The source/drain diffusion area 11b (impurity diffusion area) is formed in the surface of the semiconductor substrate 1 between the trenches 6. The source/drain diffusion area 11b reaches a side wall of the trench 6. The source/drain diffusion area 11b is shared by the two transistors 3a and 3b in the trenches 6. The gate insulating film 12 is composed of, for example, a silicon oxide film and is formed along the side wall and bottom of the trench 6.

The gate electrode 13, composed of, for example, polysilicon, is formed on the gate insulating film 12 on the side wall of the trench 6 and on the opposite side walls of each trench 6. The gate electrode 13 is formed at least on the side wall of the trench 6 between the source/drain diffusion areas 11a and 11b. Thus, when a turn-on voltage from the transistor 3 is applied to the gate electrode 13, the source/drain diffusion areas 11a and 11b are electrically connected through a channel. The trench 6 is filled with an insulating film 14 (second insulating film) such as a silicon oxide film.

The capacitor 4 is composed of a lower electrode 21, a ferroelectric film 22, and an upper electrode 23. The lower electrode 21 is composed of a material such as platinum (Pt), SRO (SrRuO$_3$), iridium (Ir), or iridium oxide (IrO$_2$), or a stacked film of these materials. The lower electrode 21 is formed on the surface of the semiconductor substrate 1 at a position corresponding to the source/drain diffusion area 11b. The lower electrode 21 is shared by the two capacitors 4a and 4b in the adjacent trenches 6.

The ferroelectric film 22 is formed for each capacitor 4. The ferroelectric films 22 belonging to the two capacitors 4a and 4b, respectively, are spaced from each other. The ferroelectric film 22 is composed of, for example, lead zirconate titanate (PZT). The upper electrode 23, composed of the same material as that of the lower electrode 21, is formed on the ferroelectric film 22.

A plate electrode (an interconnect layer) is provided on the upper electrode 23 via a connection layer 31 composed of a conductive material. The connection layer 31 is composed of, for example, aluminum (Al) or tungsten (W). The plate electrode 32 extends above the trench 6 and is connected to the connection layer 31 of the adjacent capacitor 4c beyond the trench 6.

A contact 41 extends from almost the center of the lower end of the plate electrode 32 to penetrate the insulating film 14 between the gate electrodes 13 provided on the respective side walls of the trench 6. The gate insulating film 12 at the bottom of the trench 6 is partly removed. The contact 41 passes through this removed part to the source/drain diffusion area 11a. The contact 41 has a function of electrically connecting the plate electrode 32 and the source/drain diffusion area 11a together.

The selection transistor 5 is disposed so as to connect to a terminal one of the memory cells connected in series. The selection transistor 5 is configured similarly to the memory cell transistor 3. The source/drain diffusion area 11b of the selection transistor 5 is connected to a bit line 43 via a contact 42. Reference numeral 44 denotes an interlayer insulating film.

Now, with reference to FIGS. 3 to 16, description will be given of a manufacturing method for the semiconductor memory device configured as described above.

Figure 3:
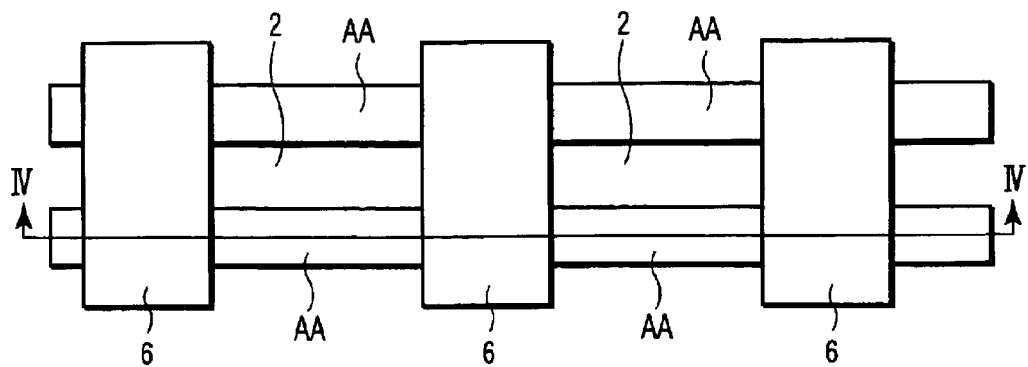
FIG. 3 is a plan view schematically showing a manufacturing process for the semiconductor memory device in FIG. 1.
Figure 4:
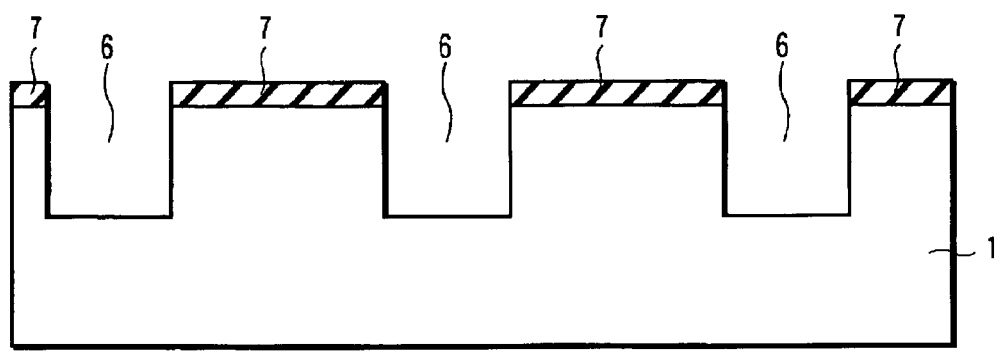
FIG. 4 is a sectional view of FIG. 3.

FIG. 3 is a plan view schematically showing a part of a manufacturing process for the semiconductor memory device in FIGS. 1 and 2. FIG. 4 is a sectional view taken along line IV—IV in FIG. 3, schematically showing the structure of the semiconductor memory device. As shown in FIGS. 3 and 4, a protective film 7 composed of, for example, a silicon nitride film is formed on the surface of the semiconductor substrate 1. Then, a lithography process and an etching technique such as RIE (Reactive Ion Etching) are used to form a trench penetrating the protective film 7 and reaching the semiconductor substrate 1. Then, for example, a silicon oxide film is buried in the trench to form the element separation insulating film 2 having an STI (Shallow Trench Isolation) structure. Then, the lithography process and etching technique are used to form trenches 6 such as RIE (Reactive Ion Etching) are used to form the trenches 6 in the surface of the semiconductor substrate 1 in element areas AA.

Figure 5:
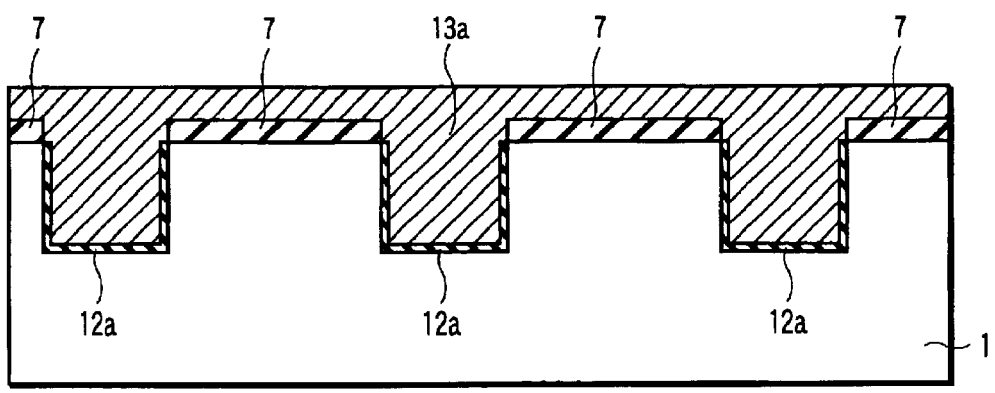
FIG. 5 is a sectional view schematically showing a step succeeding FIG. 4.

Then, as shown in FIG. 5, an insulating film 12a constituting the gate insulating film 12 is formed on the inner wall of each trench 6 and on the surface of the semiconductor substrate 1 by, for example, thermal oxidation. Then, a conductive film 13a constituting the gate electrode 13 is deposited all over the surface of the semiconductor substrate 1 using an LPCVD (Low Pressure Chemical Vapor Deposition) method or the like. Next, a CMP (Chemical Mechanical Polish) method is used to flatten the conductive film 13a using the protective film 7 as a stopper. Then, etching such as RIE is carried out to etch back the conductive film 13a until it has the same height as that of the surface of the semiconductor substrate 1. Next, the protective layer 7 is removed by etching.

Figure 6:
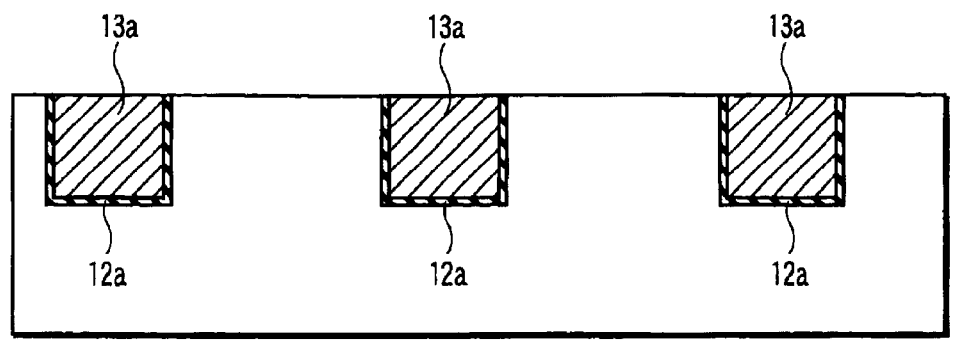
FIG. 6 is a sectional view schematically showing a step succeeding FIG. 5.

Then, as shown in FIG. 6, the conductive film 13a and the insulating film 12a on the semiconductor substrate 1 are removed using, for example, the CMP method. As a result, the gate insulating film 12 is formed on the side wall of each trench 6. Further, the conductive film 13a is buried in the trench 6.

Figure 7:
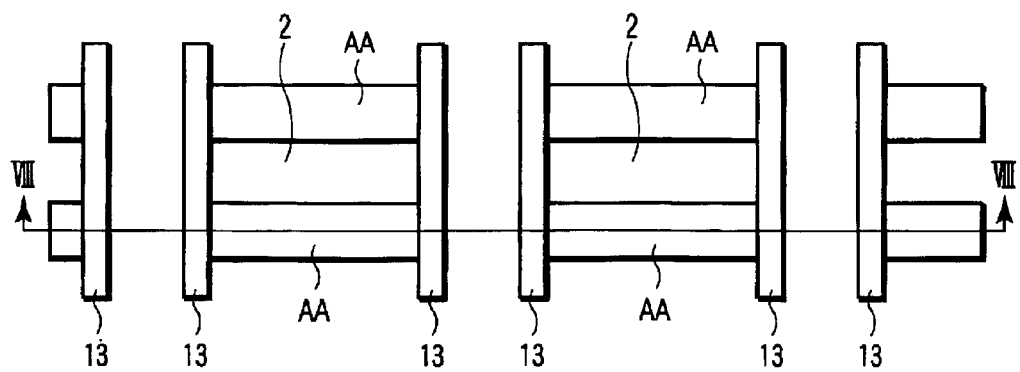
FIG. 7 is a sectional view schematically showing a step succeeding FIG. 6.
Figure 8:
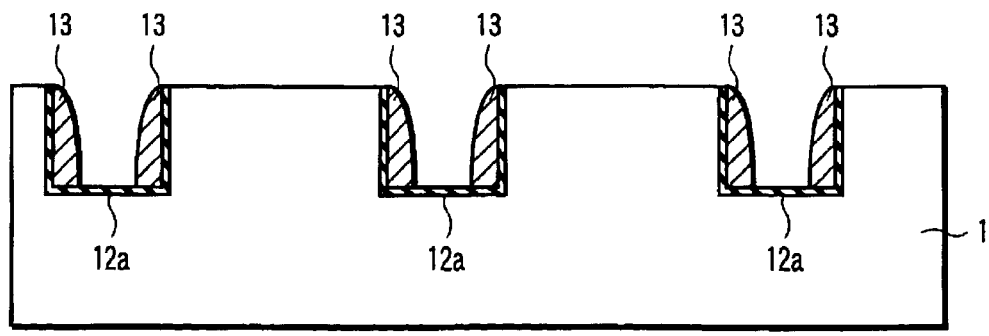
FIG. 8 is a sectional view of FIG. 7.

Then, as shown in FIG. 7 and FIG. 8 showing a cross section taken along line VIII—VIII in FIG. 7, a mask material (not shown) having a pattern of the gate electrodes 13 is deposited on the semiconductor substrate 1. Then, this mask is used to pattern the conductive film 13a by, for example, the RIE method. As a result, the gate electrodes 13 are formed. Subsequently, the mask material is removed.

Figure 9:
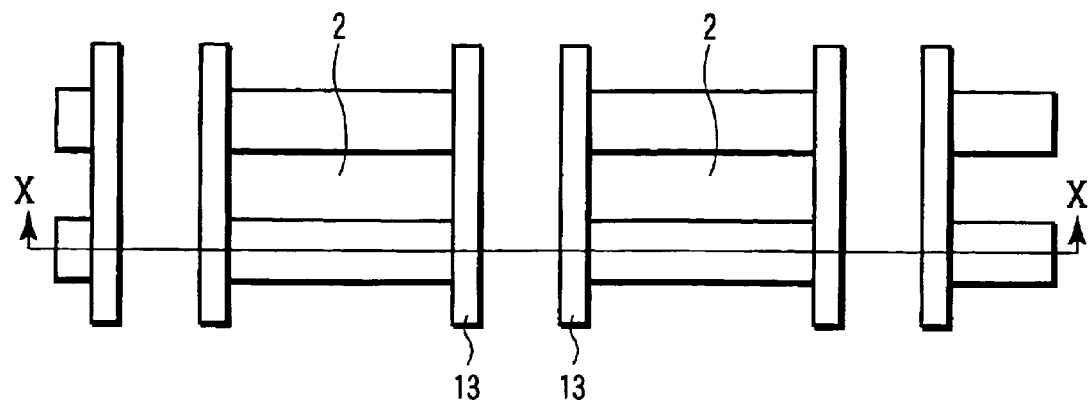
FIG. 9 is a sectional view schematically showing a step succeeding FIG. 7.
Figure 10:
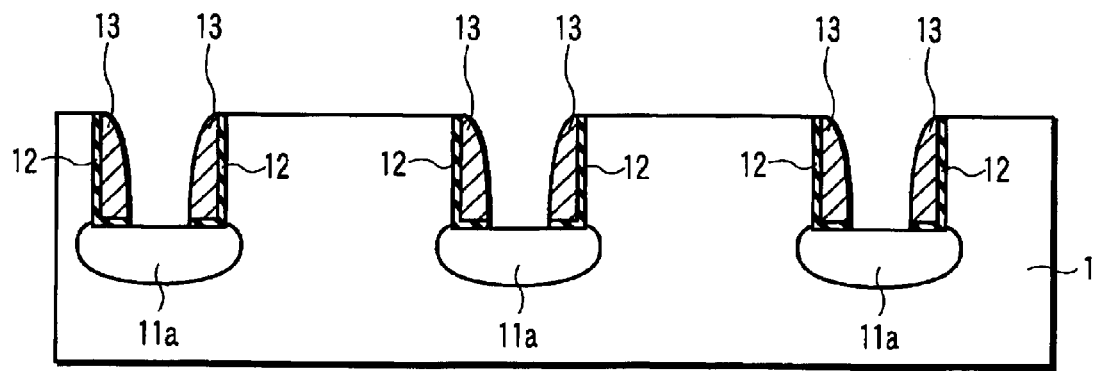
FIG. 10 is a sectional view of FIG. 9.

Then, as shown in FIG. 9 and FIG. 10 showing a cross section taken along line X—X in FIG. 9, parts of the gate insulating film 12 on which no gate electrode is provided is removed using the lithography process and etching technique. As a result, the semiconductor substrate 1 is exposed from the bottoms of the trenches 6. Then, a mask material (not shown) is used to cover the entire semiconductor substrate 1 except for these exposed portions. Ions are then injected into the exposed portions to form the source/drain diffusion area 11a. Subsequently, the mask material is removed.

Figure 11:
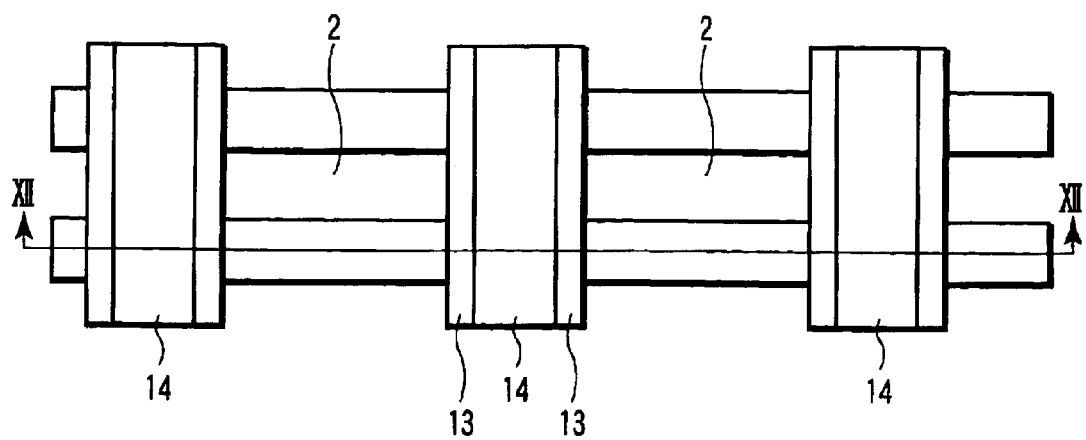
FIG. 11 is a sectional view schematically showing a step succeeding FIG. 9.
Figure 12:
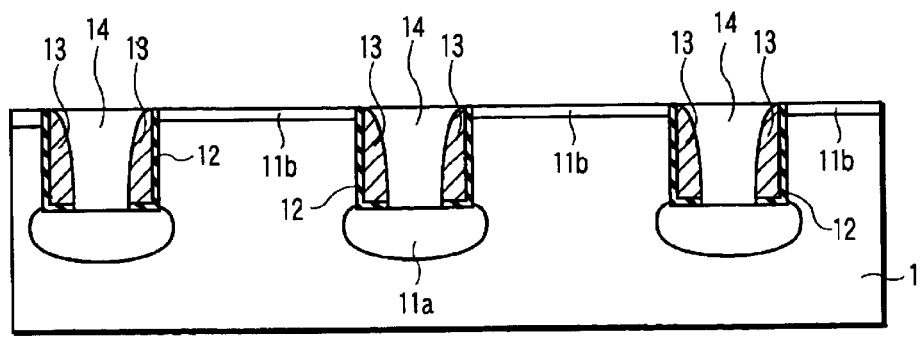
FIG. 12 is a sectional view of FIG. 11.

Then, as shown in FIG. 11 and FIG. 12 showing a cross section taken along line XII—XII in FIG. 11, a material film for the insulating film 14 is deposited all over the surface of the semiconductor substrate 1 using the CVD method or the like. Next, parts of this material film which are located on the surface of the semiconductor substrate 1 are removed. As a result, the insulating film 14 is buried in the trenches 6.

Then, a mask material (not shown) is formed on the surface of the semiconductor substrate 1. The mask material has openings in areas in which the respective source/drain diffusion areas 11b are to be formed. Then, this mask material is used as a mask to inject ions to form the source/drain diffusion areas 11b. As a result, the transistor 3 (3a to 3c) and the selection transistor 5 are formed. Subsequently, the mask material is removed.

Figure 13:
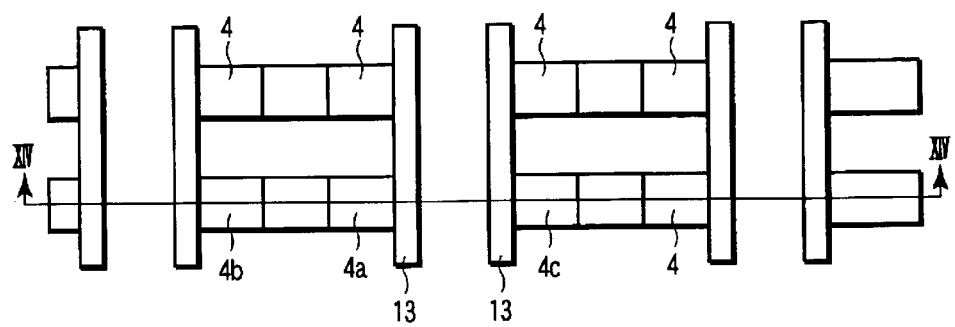
FIG. 13 is a sectional view schematically showing a step succeeding FIG. 11.
Figure 14:
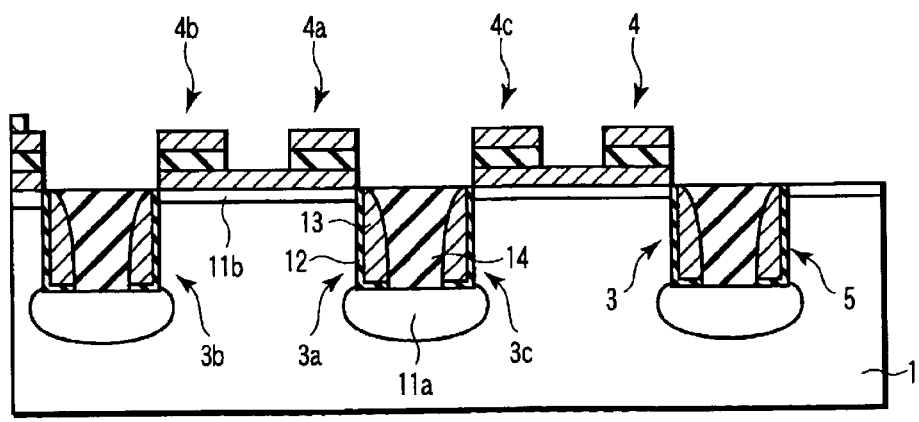
FIG. 14 is a sectional view of FIG. 13.

Then, as shown in FIG. 13 and FIG. 14 showing a cross section taken along line XIV—XIV in FIG. 13, the capacitor 4 (4a to 4c) is formed using the sputtering, lithography process, etching technique, and the like.

Then, as shown in FIG. 15 and FIG. 16 showing a cross section taken along line XVI—XVI in FIG. 15, an interlayer insulating film 44a is deposited all over the surface of the semiconductor substrate 1 using the CVD method or the like. Next, the lithographic process, etching technique, and the like are used to form contact holes and interconnection trenches. Then, a conductive material is buried in the contact holes and interconnection trenches. The excessive conductive material on the interlayer insulating film 44a is removed using the CMP method or the like. As a result, the connection layers 31, the contacts 41, and the plate electrodes 32 are formed.

Then, as shown in FIGS. 1 and 2, a further interlayer insulating film 44 is formed all over the surface of the semiconductor substrate 1. Then, the lithographic process, etching technique, and the like are used to form contact holes penetrating the interlayer insulating film 44 and reaching the source/drain diffusion areas 11b, while forming interconnection trenches in the interlayer insulating film 44. Next, the excessive conductive material on the interlayer insulating film is removed. As a result, the contacts 42 and the bit lines 43 are formed.

In the semiconductor memory device according to the first embodiment of the present invention, the transistor 3 is formed using the trench 6 formed in the surface of the semiconductor substrate 1. The gate electrode 13 is disposed along the side wall of the trench 6. Thus, a gate length can be set regardless of the plain area of the transistor 3. Consequently, a semiconductor memory device can be provided which can avoid causing the transistor 3 to produce a short channel effect even if the plain area of the transistor 3 decreases owing to the reduced size of the semi-conductor memory device.

Figure 21:
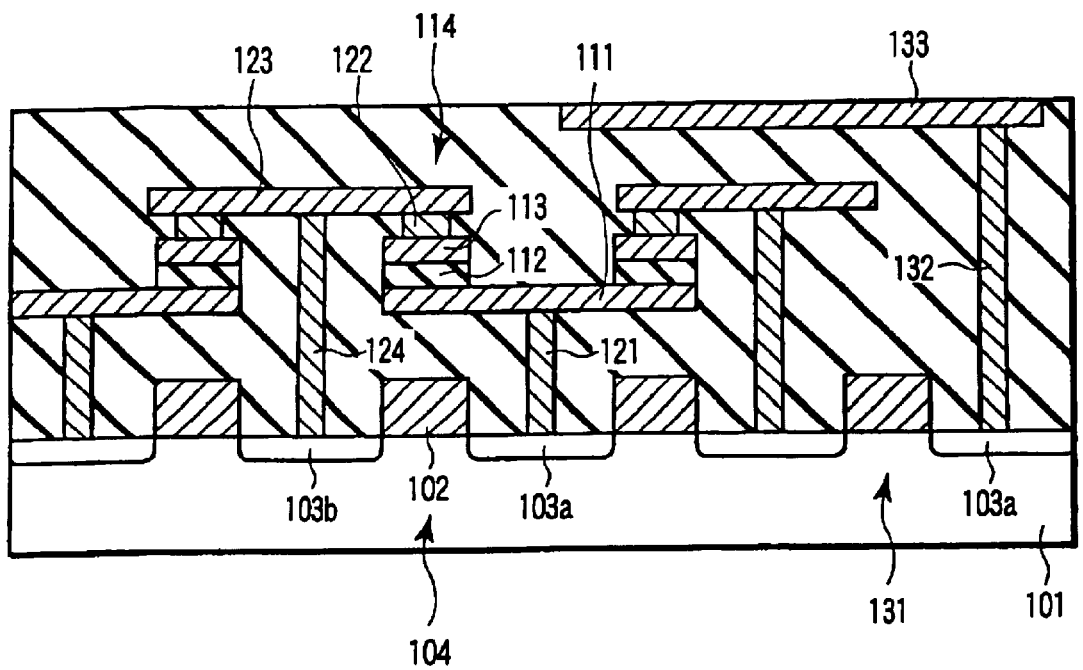
FIGS. 21 and 22 are sectional views schematically showing the conventional structure of a semiconductor memory device.
Figure 22:
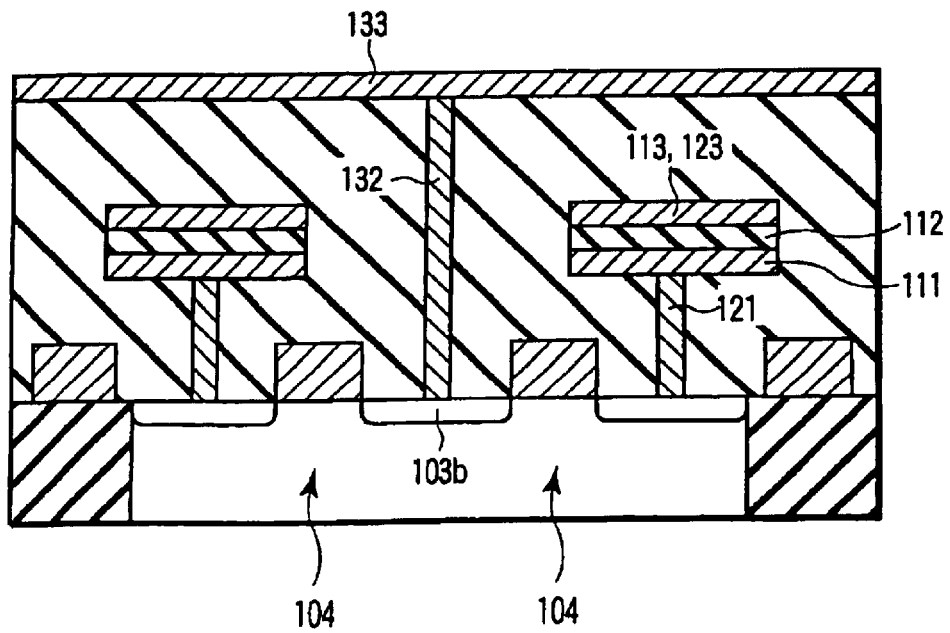

Further, the lower electrode 21 is connected to the source/drain diffusion area 11b without using any contacts (corresponding to the contacts 121 in FIG. 21). This reduces the distance between the surface of he semiconductor substrate 1 and the bit line 43, thus enabling a reduction in the aspect ratio of the contact 42. It can therefore reduce the possibility of defects in the contacts 42.

Further, in FIG. 21, it is impossible to sharply reduce the thickness of the interlayer insulating film between the gate electrode 102 and the lower electrode 111 for reliability and other reasons. Thus, since the film thickness of this portion must be maintained, the height of the contact 124 cannot be reduced. In contrast, in the semiconductor memory device according to the first embodiment, it is unnecessary to maintain the thickness of the interlayer insulating film, which is required for the structure in FIG. 21. Consequently, the aspect ratio of the contact 41 can be reduced. A shallower trench 6 enables the aspect ratio of the contact 41 to be further reduced. However, the shallower trench 6 reduces the gate length, so that too shallow a trench 6 must be avoided. Thus, if the depth of the trench 6 is set so as to obtain a gate length that is, for example, as large as that in FIG. 21, then the aspect ratio of the contact 41 can be made somewhat smaller than that of the contact 124.

As a variation of the first embodiment, the gate electrode 13 can be formed in a manner different from the one described above. This method will be described below with reference to FIG. 17.

FIG. 17 schematically shows a step succeeding FIG. 4. As shown in FIG. 17, after the insulating film 12a has been formed, the CVD method, sputtering, and the like are used to deposit the conductive film 13a on the inner walls of the trenches 6 and on the surface of the semiconductor substrate 1. In this case, the conductive film 13a is as thick as or thicker than the gate electrode 13. Subsequently, the lithography process and etching technique are used to remove the conductive film 13a from the bottoms of the trenches 6 and from the surface of the semiconductor substrate 1. As a result, as shown in FIG. 8, the gate electrodes 13 are formed. Such a step also enables the formation of the same structure as that shown in FIGS. 1 and 2. Further, such a forming method for the gate electrodes 13 is applicable to a second to fourth embodiments, described below.

(Second Embodiment)

A second embodiment has not only the arrangements of the first embodiment but also an arrangement in which each gate electrode 13 is covered with an insulating film.

Figure 18:
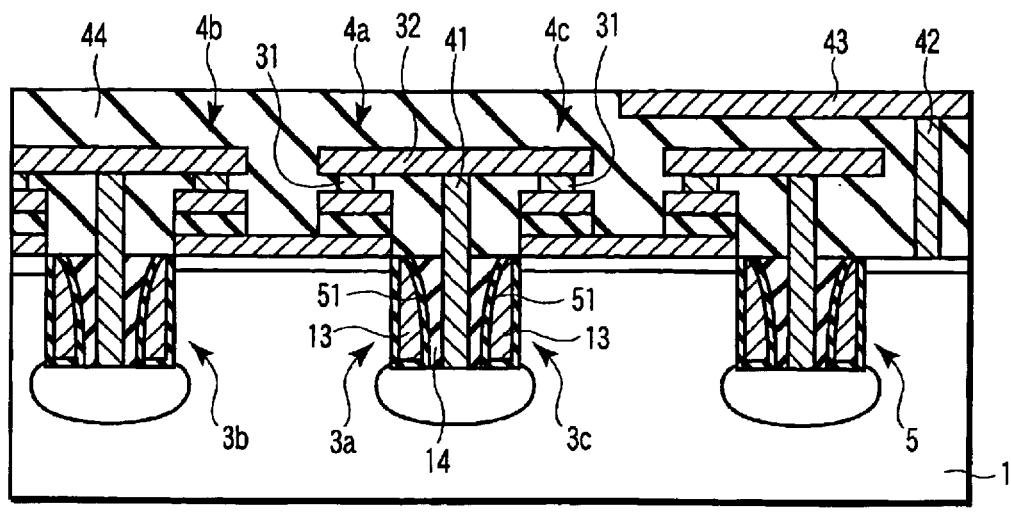
FIG. 18 is a sectional view schematically showing a semiconductor memory device according to a second embodiment of the present invention.

FIG. 18 is a sectional view schematically showing a semiconductor memory device according to a second embodiment of the present invention. As shown in FIG. 18, each gate electrode 13 is covered with a covering insulating film 51. The covering insulating film 51 is substantially composed of a material different from that of the insulating film 14, buried in the trench 6. More specifically, this material has an etching rate different from that of the insulating film 14. Further specifically, if the insulating film 14 is made of silicon oxide, the covering insulating film is made of silicon nitride.

The structure shown in FIG. 18 is realized by, for example, after the step in FIG. 8 for the first embodiment, depositing a material film for the covering insulating film 51 all over the surface of the semiconductor substrate 1 and patterning this material film using a known method.

According to the second embodiment of the present invention, the semiconductor memory device has a structure similar to that of the first embodiment and produces effects similar to those of the first embodiment. Furthermore, in the second embodiment, the gate electrode 13 is covered with the covering insulating film 51. Thus, if a mask material is misaligned when a contact hole for the contact 41 is formed, it is avoidable that the contact 41 comes into contact with the gate electrode 13.

Further, the contact 41 can be formed in a self-alignment manner to the covering insulating film 51. When the contact 41 is formed in a self-alignment manner, it is not necessary to provide an additional margin for the possible misalignment of the mask. The area of the trench 6 can thus be reduced. As a result, the size of the semiconductor memory device can further be reduced.

(Third Embodiment)

A third embodiment relates to a general ferroelectric memory that does not have a TC-parallel-unit series connection type structure. That is, memory cells are each composed of a capacitor consisting of a ferroelectric material as well as a transistor, and are each arranged at the point of intersection between a word line and a bit line. The capacitors of the memory cells connected to the same word line are connected together via a plate line.

Figure 19:
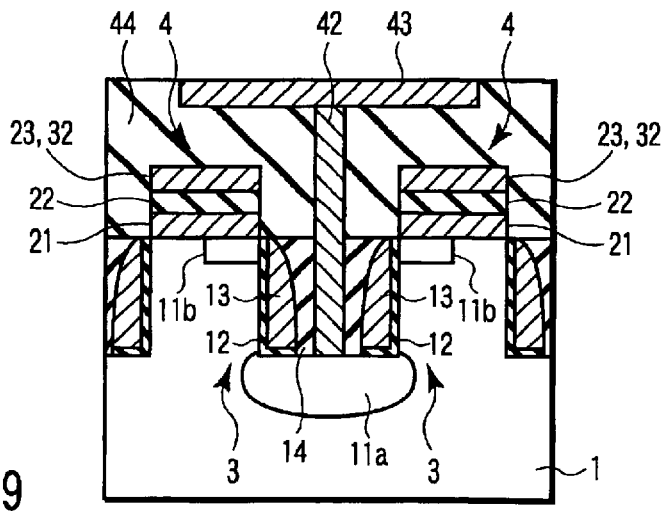
FIG. 19 is a sectional view schematically showing a semiconductor memory device according to a third embodiment of the present invention.

FIG. 19 is a sectional view schematically showing a semiconductor memory device according to a third embodiment of the present invention. As shown in FIG. 19, only one end of each source/drain diffusion area 11b reaches the side wall of the corresponding trench 6. The ferroelectric film 22 and the upper electrode 23 both cover the lower electrode 21 from end to end. The upper electrode 23 is also used as the plate electrode 32.

The contact 42 is connected to the bit line 43 and penetrates the interlayer insulating film 44 and the insulating film 14 to reach the source/drain diffusion area 11a.

In the semiconductor memory device according to the third embodiment of the present invention, as in the case with the first embodiment, each transistor 3 is formed using the corresponding trench 6. Further, each gate electrode 13 is formed along the side wall of the corresponding trench 6. Thus, the gate length can be set regardless of the plain area of the transistor 3. Therefore, a semiconductor memory device can be provided which can avoid causing the transistor 3 to produce a short channel effect even if the plain area of the transistor 3 decreases owing to the reduced size of the semiconductor memory device.

(Fourth Embodiment)

Figure 20:
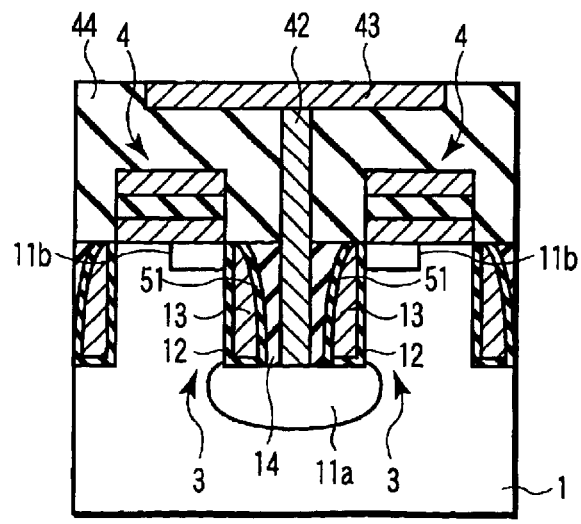
FIG. 20 is a sectional view schematically showing a semiconductor memory device according to a fourth embodiment of the present invention.

A fourth embodiment has a structure corresponding to a combination of the third embodiment and the second embodiment. FIG. 20 is a sectional view schematically showing a semiconductor memory device according to a fourth embodiment of the present invention. As shown in FIG. 20, each gate electrode 13 is covered with the covering insulating film 51. The other parts of the structure are similar to those of the third embodiment.

The semiconductor memory device according to the fourth embodiment of the present invention produces effects corresponding to the combination of the third embodiment and the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a first trench formed in a surface of the semiconductor substrate and having a first side wall;
   a first impurity diffusion area formed in the semiconductor substrate at a bottom of the first trench;
   a second impurity diffusion area formed in the surface of the semiconductor substrate, having one end in contact with the first side wall, and having the same conductive type as that of the first impurity diffusion area;
   a first gate electrode provided on the first side wall between the first impurity diffusion area and second impurity diffusion area with a gate insulating film interposed therebetween;
   a first lower electrode provided on the second impurity diffusion area;
   a first ferroelectric film provided on the first lower electrode;
   a first upper electrode provided on the first ferroelectric film;
   a first interconnection layer provided above the first upper electrode; and
   a first contact plug partly provided in the first trench and electrically connecting the first interconnection layer and first impurity diffusion area.

2. The device according to claim 1, wherein the first upper electrode and the first interconnection layer are electrically connected together.

3. The device according to claim 1, having a plurality of memory cells electrically connected together, the memory cells each comprising a transistor and a capacitor, the transistor having the first and second impurity diffusion areas and the first gate electrode, the capacitor having the first lower electrode, the first ferroelectric film, and the first upper electrode.

4. The device according to claim 1, further comprising:
   a second trench formed in the surface of the semiconductor substrate apart from the first trench and having a second side wall located opposite to the first side wall with a part of the semiconductor substrate positioned therebetween, the second side wall contacts the other end of the second impurity diffusion area;
   a third impurity diffusion area formed in the semiconductor substrate at a bottom of the second trench and having the same conductive type as that of the first impurity diffusion area;
   a second gate electrode provided on the second side wall between the second impurity diffusion area and third impurity diffusion area with a gate insulating film interposed therebetween;
   a second ferroelectric film provided on the first lower electrode, the second ferroelectric film being apart from the first ferroelectric film;
   a second upper electrode provided on the second ferroelectric film;
   a second interconnection layer provided above the second upper electrode; and
   a second contact plug electrically connecting the second interconnection layer and the third impurity diffusion area together.

5. The device according to claim 4, wherein the second upper electrode and the second interconnection layer are electrically connected together.

6. The device according to claim 4, wherein the second contact plug is partly provided in the second trench.

7. The device according to claim 1, further comprising:
   a fourth impurity diffusion area formed in the surface of the semiconductor substrate, having one end contacting the third side wall located opposite to the first side wall of the first trench, and having the same conductive type as that of the first impurity diffusion area;
   a third gate electrode provided on the third side wall between the first impurity diffusion area and fourth impurity diffusion area with a gate insulating film interposed therebetween;
   a second lower electrode provided on the fourth impurity diffusion area;
   a third ferroelectric film provided on the second lower electrode; and
   a third upper electrode provided on the third ferroelectric film.

8. The device according to claim 7, wherein the first and third upper electrodes and the first interconnection layer are electrically connected together.

9. The device according to claim 1 further comprising:
   a first wiring provided above the first interconnection layer; and
   a second contact plug having one end contacting the first wiring and another end contacting the surface of the semiconductor substrate.

10. A semiconductor device comprising:
    a semiconductor substrate;
    a first trench formed in a surface of the semiconductor substrate and having a first side wall;
    a first impurity diffusion area formed in the semiconductor substrate at a bottom of the first trench;
    a second impurity diffusion area formed in the surface of the semiconductor substrate, having one end in contact with the first side wall, and having the same conductive type as that of the first impurity diffusion area;
    a first gate electrode provided on the first side wall between the first impurity diffusion area and second impurity diffusion area with a gate insulating film interposed therebetween;
    a first lower electrode provided on the second impurity diffusion area;
    a first ferroelectric film provided on the first lower electrode;
    a first upper electrode provided on the first ferroelectric film;
    a first interconnection layer provided above the first upper electrode;
    a first contact plug electrically connecting the first interconnection layer and first impurity diffusion area;
    a first insulating film covering the first gate electrode; and
    a second insulating film which is buried in the first trench and different from the first insulating film.

11. The device according to claim 10, wherein the first insulating film and the second insulating film have different etching rates.

12. A semiconductor memory device comprising:

a plurality of memory cells connected in series, the memory cells each including a transistor and a capacitor having opposite ends connected to respective ends of the transistor, a plurality of interconnection layers; and a plurality of first contact plugs; wherein each transistor comprises:

a first impurity diffusion area formed in a semiconductor substrate at a bottom of one of a plurality of trenches formed in a surface of the semiconductor substrate;

a second impurity diffusion area formed in the surface of the semiconductor substrate between the trenches, having opposite ends contacting side walls of the trenches, and having the same conductive type as that of the first impurity diffusion area; and a gate electrode provided on the side wall of the trench between the first impurity diffusion area and the second impurity diffusion area with a gate insulating film interposed therebetween, and each capacitor comprises:

a lower electrode provided on the second impurity diffusion area;

a ferroelectric film provided on the lower electrode; and an upper electrode provided on the ferroelectric film, the semiconductor device, each of the plurality of first contact plugs is partly provided in one of the plurality of trenches and electrically connects one of the plurality of interconnection layers and the first impurity diffusion area, and each of the plurality of interconnection layers electrically connects the upper electrode of the capacitor of one of the plurality of memory cells and the upper electrode of the capacitor of adjacent one of the plurality of memory cells.

13. The device according to claim 12, wherein each of the lower electrodes is shared by the capacitor of one of the plurality of memory cells and the capacitor of adjacent one of the plurality of memory cells.

14. The device according to claim 12 further comprising:

a first wiring provided above one of the plurality of interconnection layers; and a second contact plug having one end contacting the first wiring and another end contacting the surface of the semiconductor substrate.

15. A semiconductor memory device having a plurality of memory cells connected in series, the memory cells each including a transistor and a capacitor having opposite ends connected to respective ends of the transistor, wherein each transistor comprises:

a first impurity diffusion area formed in a semiconductor substrate at a bottom of one of a plurality of trenches fanned in a surface of the semiconductor substrate;

a second impurity diffusion area formed in the surface of the semiconductor substrate between the trenches, having opposite ends contacting side walls of the trenches, and having the same conductive type as that of the first impurity diffusion area; and a gate electrode provided on the side wall of the trench between the first impurity diffusion area and the second impurity diffusion area with a gate insulating film interposed therebetween, and each capacitor comprises:

a lower electrode provided on the second impurity diffusion area;

a ferroelectric film provided on the lower electrode;

an upper electrode provided on the ferroelectric film; and a plurality of first insulating films each of which covers a corresponding one of the plurality of gate electrodes; and a plurality of second insulating films each of which is buried in a corresponding one of the plurality of trenches, the second insulating films different from the first insulating films.

16. The device according to claim 15, wherein the first insulating films and the second insulating films have different etching rates.

17. The device according to claim 15, wherein the third insulating film has an etching rate different from those of the first insulating film and the second insulating film.

18. A method of manufacturing a semiconductor memory device comprising:

forming a trench in a surface a semiconductor substrate;

forming a first impurity diffusion area in the semiconductor substrate at a bottom of the trench;

forming a gate insulating film on a side wall and the bottom of the trench;

forming a gate electrode on the gate insulating film;

forming a second impurity diffusion area in the surface of the semiconductor substrate, the second impurity diffusion area having one end contacting the side wall of the trench, the second impurity diffusion area having the same conductive type as that of the first impurity diffusion area;

forming a lower electrode on the second impurity diffusion area;

forming a ferroelectric film on the lower electrode;

forming an upper electrode on the ferroelectric film;

forming a contact plug electrically connected to the first impurity diffusion area; and forming an interconnection layer above the upper electrode, the interconnection layer being electrically connected to the contact plug.

19. The method according to claim 18, wherein forming the gate electrode comprises:

burying a material film for the gate electrode in the trench; and patterning the material film so that a part of the material film extending along the side wall of the trench remains.

20. The method according to claim 18, wherein forming the gate electrode comprises:

depositing a material film for the gate electrode on the side wall and bottom of the trench, the material film having a larger film thickness than the gate electrode; and removing a part of the material film on the bottom of the trench.

21. The method according to claim 18, further comprising:

forming a first insulating film on the gate electrode, the first insulating film being composed of a material different from that of the gate electrode; and burying a second insulating film in the trench, the second insulating film being different from the first insulating film.

22. A method of manufacturing a semiconductor memory device having a plurality of memory cells connected in series, the memory cells each including a transistor and a capacitor having opposite ends connected to respective ends of the transistor, the method comprising:

forming a plurality of trenches in a surface of a semiconductor substrate, the trenches being apart from one another;

forming first impurity diffusion areas in the semiconductor substrate at a bottom of each of the trenches;

forming gate insulating films on side walls and a bottom of each of the trenches;

forming gate electrodes on each of the gate insulating films;

forming second impurity diffusion areas in the surface of the semiconductor substrate between the adjacent trenches, the second impurity diffusion areas each having opposite ends contacting the side walls of the trenches and having the same conductive type as that of the first impurity diffusion area;

forming lower electrodes on each of the second impurity diffusion areas;

forming ferroelectric films on each of the respective lower electrodes, the ferroelectric films being apart from one another;

forming upper electrodes on each of the respective ferroelectric films;

forming contact plugs electrically connected to each of the first impurity diffusion areas; and forming interconnection layers above the respective upper electrodes, the interconnection layers each being electrically connected to each of the contact plugs.

23. The method according to claim 22, wherein forming the gate electrode comprises:

burying a material film for the gate electrode in each of the trenches; and patterning the material film so that a part of the material film extending along the side wall of each of the trenches remains.

24. The method according to claim 22, wherein forming the gate electrode comprises:

depositing a material film for the gate electrode on the side wall and bottom of each of the trenches, the material film having a larger film thickness than the gate electrode; and removing a part of the material film on the bottom of each of the trenches.

25. The method according to claim 22, further comprising:

forming first insulating films on the respective gate electrodes, the first insulating films being each composed of a material different from that of the gate electrodes; and burying a second insulating film in each of the trenches, the second insulating film being different from the first insulating film.

26. A semiconductor memory device comprising:

a semiconductor substrate;

a trench formed in a surface of the semiconductor substrate and having a first side wall and a second side wall;

a first impurity diffusion area formed in the semiconductor substrate at a bottom of the trench;

a second impurity diffusion area formed in the surface of the semiconductor substrate, having one end in contact with the first side wall;

a third impurity diffusion area formed in the surface of the semiconductor substrate, having one end in contact with the second side wall;

a first gate electrode provided on the first side wall with a gate insulating film interposed therebetween;

a second gate electrode provided on the second side wall with a gate insulating film interposed therebetween;

a first lower electrode provided on the second impurity diffusion area;

a first ferroelectric film provided on the first lower electrode;

a first upper electrode provided on the first ferroelectric film;

a second lower electrode provided on the third impurity diffusion area;

a second ferroelectric film provided on the second lower electrode;

a second upper electrode provided on the second ferroelectric film;

an interconnection layer provided above the first upper electrode and the second upper electrode; and a contact plug having one end which contacts the interconnection layer and another end which is in the trench and contacts the first diffusion area.

27. The device according to claim 26, wherein, a basic unit is composed of the semiconductor substrate, trench, first impurity diffusion area, second impurity diffusion area, third impurity diffusion area, first gate electrode, second gate electrode, first lower electrode, first ferroelectric film, first upper electrode, second lower electrode, second ferroelectric film, second upper electrode, interconnection layer, and contact plug, the device includes a plurality of the basic units, and the second diffusion layer and the first lower electrode of one of the plurality of the basic units are connected to the third diffusion layer and the second lower electrode of adjacent one of the plurality of the basic units, respectively.

28. The device according to claim 26, further comprising:

a first insulating film covering the first gate electrode;

a second insulating film covering the second gate electrode; and a third insulating film buried in the trench.

* * * * *